United States Patent
Debroy et al.

(10) Patent No.: US 11,700,001 B1
(45) Date of Patent: Jul. 11, 2023

(54) SYSTEM AND METHOD FOR NANOMAGNET BASED LOGIC DEVICE

(71) Applicant: Ceremorphic, Inc., San Jose, CA (US)

(72) Inventors: Sanghamitra Debroy, Hyderabad (IN); Akshaykumar Salimath, Hyderabad (IN); Venkat Mattela, San Jose, CA (US)

(73) Assignee: CEREMORPHIC, INC., San Jose, CA (US)

( * ) Notice: Subject to any disclaimer, the term of this patent is extended or adjusted under 35 U.S.C. 154(b) by 0 days.

(21) Appl. No.: 17/589,845

(22) Filed: Jan. 31, 2022

(51) Int. Cl.
*H03K 19/16* (2006.01)
*H03K 19/20* (2006.01)
*B82Y 10/00* (2011.01)

(52) U.S. Cl.
CPC ............. *H03K 19/16* (2013.01); *H03K 19/20* (2013.01); *B82Y 10/00* (2013.01)

(58) Field of Classification Search
CPC ......... B82Y 10/00; H03K 19/16; H03K 19/20
See application file for complete search history.

(56) References Cited

U.S. PATENT DOCUMENTS

| | | | | |
|---|---|---|---|---|
| 8,558,571 | B2* | 10/2013 | Behin-Aein | H03K 19/16 326/104 |
| 8,872,547 | B2* | 10/2014 | Becherer | H10N 59/00 365/158 |
| 9,391,262 | B1* | 7/2016 | Nikonov | G11C 11/1673 |
| 10,447,277 | B1* | 10/2019 | Kazemi | H10N 50/80 |
| 2015/0341036 | A1* | 11/2015 | Manipatruni | H01F 10/3268 326/101 |

* cited by examiner

*Primary Examiner* — Kurtis R Bahr
(74) *Attorney, Agent, or Firm* — Minisandram Law Firm; Raghunath S. Minisandram

(57) ABSTRACT

A system and method for a logic device is disclosed. A first substrate, a second substrate and a third substrate is provided. A first input nanomagnet is disposed over the first substrate, a second input nanomagnet is disposed over the second substrate, and a third input nanomagnet is disposed over the third substrate. A spacer layer is disposed over the first input nanomagnet, the second input nanomagnet, and the third input nanomagnet. An output magnet is disposed over the spacer layer.

20 Claims, 7 Drawing Sheets

NAND 000 input

NAND 001 input

NAND 010 inputs

NAND 011 inputs

| | INPUT | OUTPUT | LOGIC TYPE |
|---|---|---|---|
| 408 | 000 | 1 | NAND |
| 410 | 001 | 1 | |
| 412 | 010 | 1 | |
| 414 | 011 | 0 | |
| 416 | 100 | 1 | NOR |
| 418 | 101 | 0 | |
| 420 | 110 | 0 | |
| 422 | 111 | 0 | |

SYSTEM AND METHOD FOR NANOMAGNET BASED LOGIC DEVICE

RELATED APPLICATION

None

TECHNICAL FIELD

The present invention relates generally to logic devices and more specifically, to nanomagnet based logic devices.

DESCRIPTION OF RELATED ART

The complementary metal-oxide semiconductor (CMOS) technology based logic devices are reaching their physical limits in terms of reliability and power consumption in current day application. Further, continued requirement for minimal power consumption in computing devices configured to use these logic devices and utilization of semiconductor technology to construct these logic devices are desirable for mass adaptation of these devices. With these needs in mind, the current disclosure arises. This brief summary has been provided so that the nature of the disclosure may be understood quickly. A more complete understanding of the disclosure can be obtained by reference to the following detailed description of the various embodiments thereof in connection with the attached drawings.

SUMMARY OF THE INVENTION

In one embodiment, a method is disclosed. A first substrate, a second substrate and a third substrate is provided. A first input nanomagnet is disposed over the first substrate, a second input nanomagnet is disposed over the second substrate, and a third input nanomagnet is disposed over the third substrate. A spacer layer is disposed over the first input nanomagnet, the second input nanomagnet, and the third input nanomagnet. An output magnet is disposed over the spacer layer.

In another embodiment, a logic device is disclosed. A first substrate, a second substrate and a third substrate is provided. A first input nanomagnet is disposed over the first substrate, a second input nanomagnet is disposed over the second substrate, and a third input nanomagnet is disposed over the third substrate. A spacer layer is disposed over the first input nanomagnet, the second input nanomagnet, and the third input nanomagnet. An output magnet is disposed over the spacer layer.

This brief summary is provided so that the nature of the disclosure may be understood quickly. A more complete understanding of the disclosure can be obtained by reference to the following detailed description of the preferred embodiments thereof in connection with the attached drawings.

BRIEF DESCRIPTION OF THE DRAWINGS

The foregoing and other features of several embodiments are described with reference to the drawings. In the drawings, the same components have the same reference numerals. The illustrated embodiments are intended to illustrate but not limit the invention. The drawings include the following figures:

FIG. 4 shows an example table, showing various inputs to the logic device and corresponding outputs of the logic device, according to one aspect of the present disclosure.

DETAILED DESCRIPTION

To facilitate an understanding of the adaptive aspects of the present disclosure, an example logic device will be described. The specific construction and operation of the adaptive aspects of various elements of the example logic device is also described.

Figure 1:
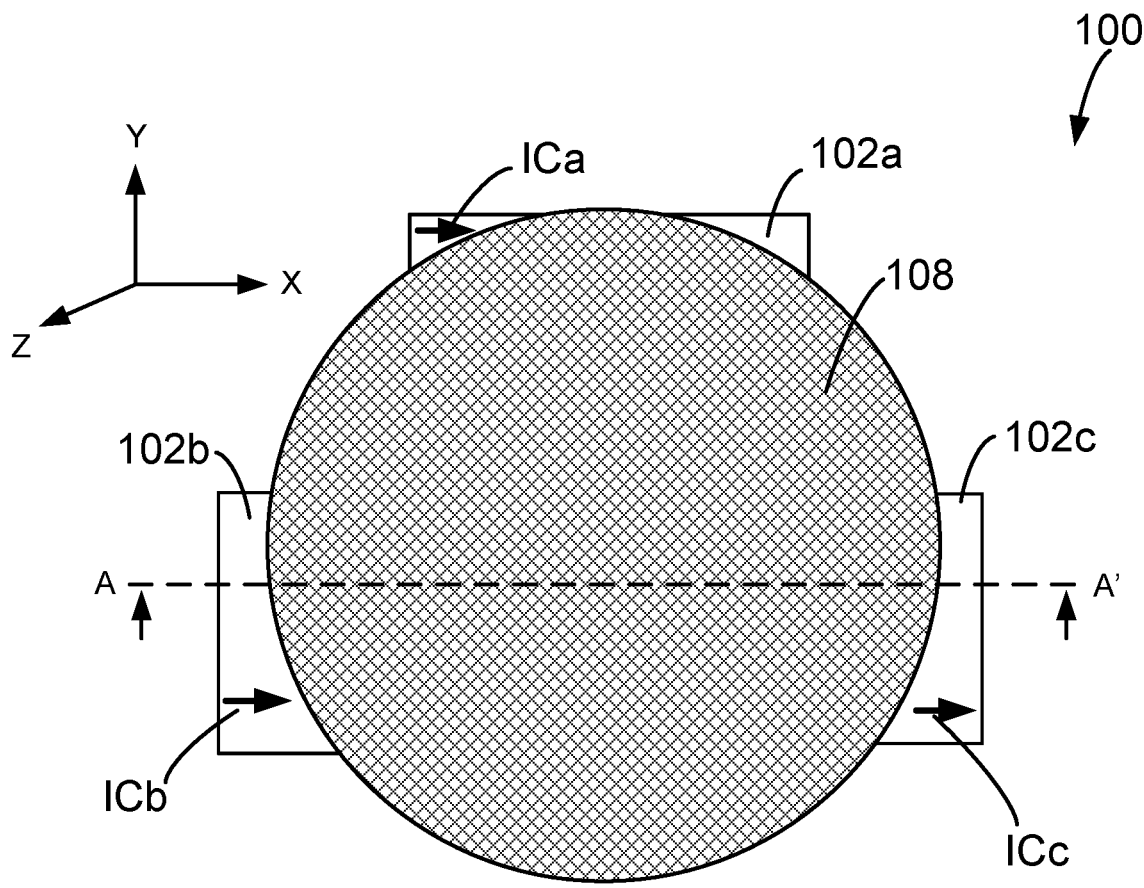
FIGS. 1 and 1A show an example logic device, according to one aspect of the present disclosure.
Figure 1A:
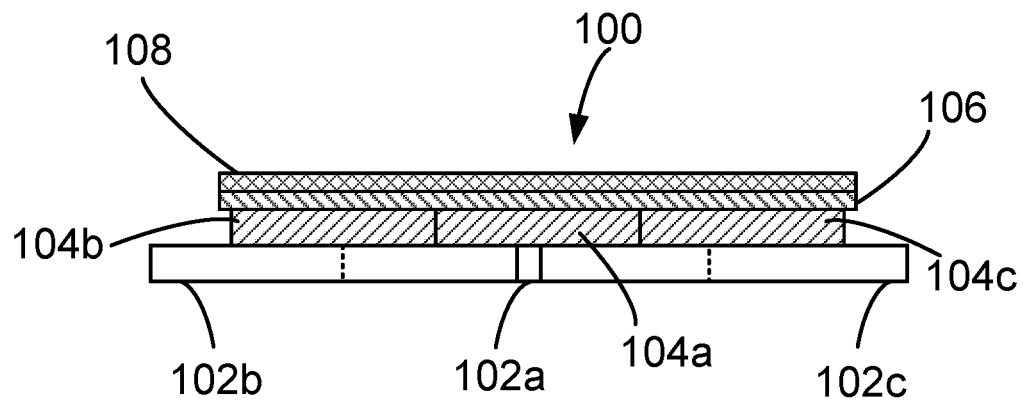

FIG. 1 shows a plan view of an example logic device 100. FIG. 1A shows a cross-sectional view of the logic device 100, along line A-A'. Now, referring to FIGS. 1 and 1A, the logic device 100 includes a first substrate 102a, a second substrate 102b, and third substrate 102c, a first input nanomagnet 104a, a second input nanomagnet 104b, and a third input nanomagnet 104c, a spacer layer 106, and an output magnet 108. The first substrate 102a, second substrate 102b, and third substrate 102c are conductive metal layers. The first substrate 102a, second substrate 102b, and third substrate 102c are substantially made of heavy metal, such as an alloy of β-Tantalum (β-Ta), Platinum (Pt), or β-Tungsten (β-W) or an alloy of heavy metal. In one example, first substrate 102a, second substrate 102b, and third substrate 102c are each a layer of thin film with a very large spin hall angle, such as a layer of thin film of β-Tantalum (β-Ta), Platinum (Pt), or β-Tungsten (β-W) or an alloy of β-Tantalum (β-Ta), Platinum (Pt), or β-Tungsten (β-W). The first substrate 102a, second substrate 102b, and third substrate 102c are configured to receive a charge current and convert the charge current into a spin current, through spin Hall effect. For example, the first substrate 102a receives a first charge current ICa, second substrate 102b receives a second charge current ICb, and third substrate 102c receives a third charge current ICc.

The dimensions of first substrate 102a, second substrate 102b, and third substrate 102c may be selected so as to have a charge current density of about 7.5 $e^{12}$ Amperes/meter$^2$ through each of the first substrate 102a, second substrate 102b, and third substrate 102c. As one skilled in the art appreciates, the first substrate 102a, second substrate 102b, and third substrate 102c may be deposited on a base layer (not shown). In some examples, base layer may be a silicon wafer.

Figure 1B:
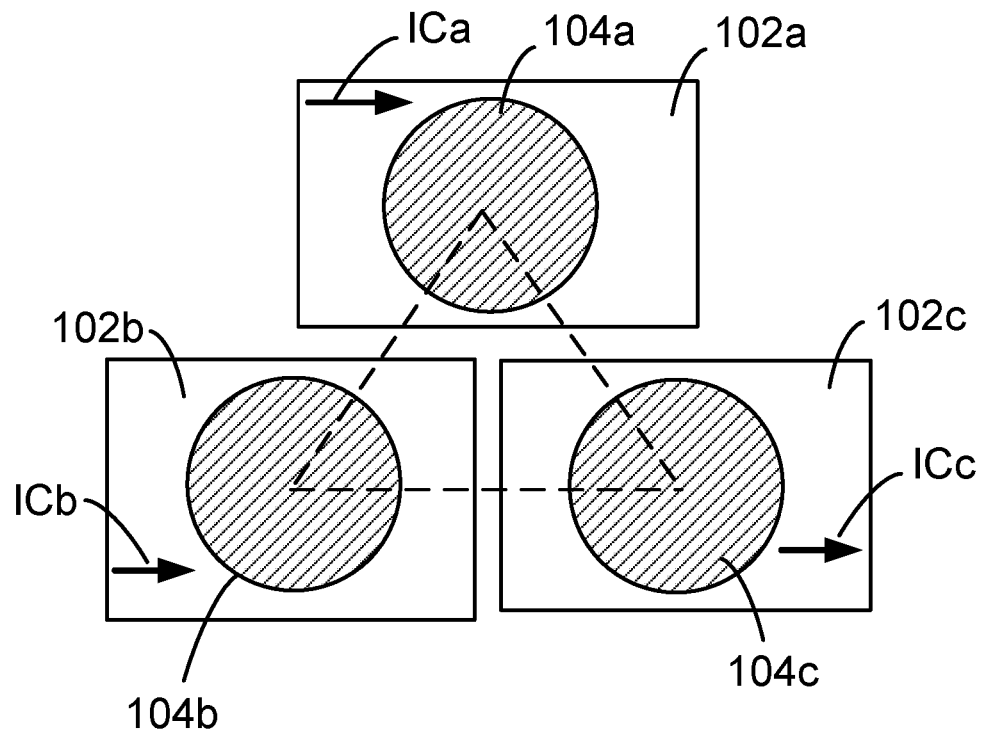
FIGS. 1B, 1C, and 1D show various elements of the logic device of FIG. 1, according to one aspect of the present disclosure.

Now, referring to FIG. 1B, the first input nanomagnet 104a is disposed over the first substrate 104a, the second input nanomagnet 104b is disposed over the second substrate 102b, and a third input nanomagnet 104c is disposed over the third substrate 102c. Each of the first input nanomagnet 104a, the second input nanomagnet 104b, and the third input nanomagnet 104c are selectively disposed on the first substrate 102a, second substrate 102b, and third substrate 102c respectively, equidistant from each other. In one example, the first input nanomagnet 104a, the second input nanomagnet 104b, and the third input nanomagnet 104c are substantially cylindrical, with a diameter D of about 8 nm. A thickness of the first input nanomagnet 104a, the second input nanomagnet 104b, and the third input nanomagnet 104c are about 5 nm. In one example, the first input nanomagnet 104a, the second input nanomagnet 104b, and the third input nanomagnet 104c are selectively disposed over the first substrate 102a, second substrate 102b, and third substrate 102c respectively, substantially at the vertex of an equilateral triangle 110. In one example, by selectively disposing the first input nanomagnet 104a, the second input nanomagnet 104b, and the third input nanomagnet 104c at the vertex of an equilateral triangle 110, all of the first input nanomagnet 104a, the second input nanomagnet 104b, and the third input nanomagnet 104c will have substantially equal contribution to the state of the output nanomagnet 108.

Figure 1C:
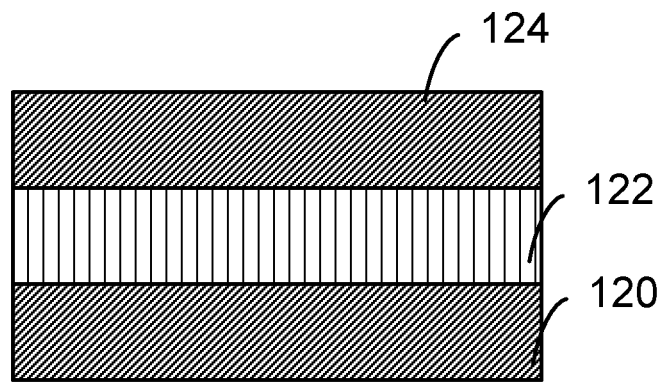

Now, referring to FIG. 1C, the construction of the first input nanomagnet 104a is described. In one example, construction of second input nanomagnet 104b and third input magnet 104c is similar to the construction of the first input nanomagnet 104a. The first input nanomagnet 104a includes a first layer 120, a second layer 122, and a top layer 124. The first layer 120 is composed of a CoFe alloy. The second layer 122 is a Ruthenium (Ru) or an alloy of Ruthenium deposited over the first layer 120. And the top layer 124 is a CoFe alloy deposited over the second layer 122. In one example, a thickness of the first layer 120 is about 5 nm. The dimensions of the second layer 122 and the dimensions of the top layer 124 are so chosen so as to maintain a coupling strength J between the first layer 120 and the top layer 124 to be maintained around $J=-1\times10^{-3}$ J/m2. In one example, the dimensions and construction of first input nanomagnet 104a is such that it performs as a single domain nanomagnet.

Figure 1D:
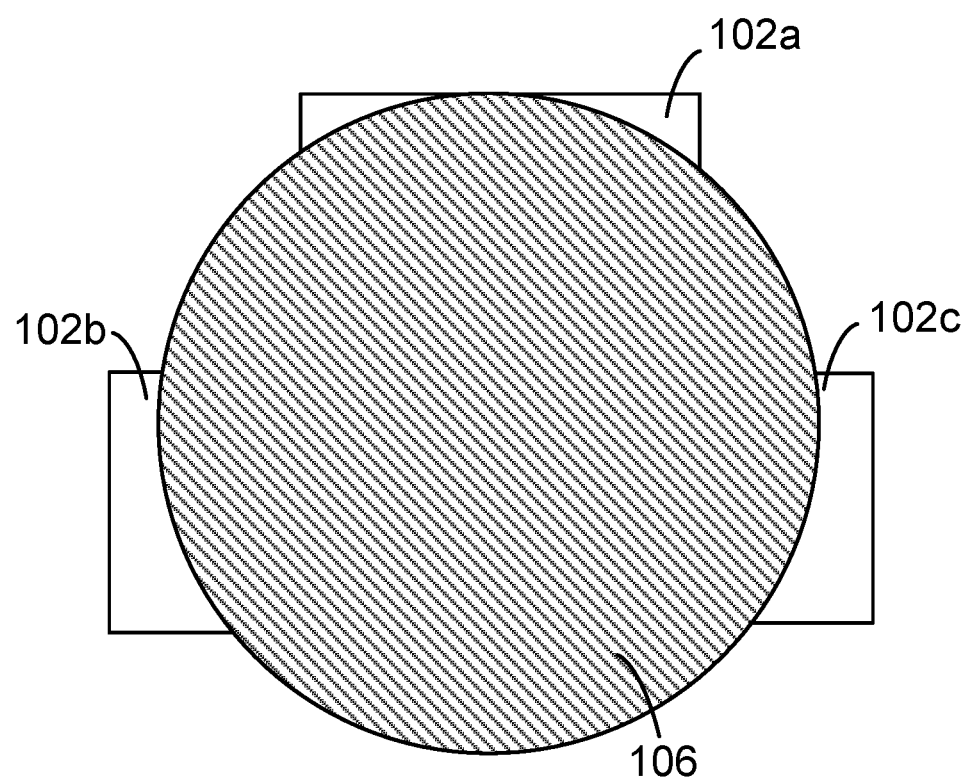

Now, referring to FIG. 1D, the spacer layer 106 is selectively disposed over the first input nanomagnet 104a, second input nanomagnet 104b, and third input nanomagnet 104c, to substantially cover the first input nanomagnet 104a, second input nanomagnet 104b, and third input nanomagnet 104c. The spacer layer 106 is made of a non-magnetic material. The diameter of the spacer layer 106 is about 20 nm.

Now, referring back to FIGS. 1 and 1A, the output magnet 108 is selectively disposed over the spacer layer 106. In one example, the output magnet 108 is selectively positioned over the space layer 106 such that the output magnet 108 is subjected to substantially equal effect from the first input nanomagnet 104a, second input magnet 104b, and third input magnet 104c. In one example, the output magnet 108 is substantially cylindrical, with a diameter D of about 20 nm. In one example, the dimensions and construction of the output magnet 108 is such that it performs as a single domain nanomagnet.

Having generally described the construction of the logic device 100, example general operation of the logic device 100 will now be described, with reference to FIG. 1. The orientation of the magnetic domain of each of the first input nanomagnet 104a, second input nanomagnet 104b, and third input nanomagnet 104c are selectively set by passing the first charge current ICa, the second charge current ICb, and the third charge current ICc, through the first substrate 102a, the second substrate 102b, and the third substrate 102c, respectively. The orientation of the magnetic domain of each of the first input nanomagnet 104a, second input nanomagnet 104b, and third input nanomagnet 104c depends upon the direction of flow of the first charge current ICa, the second charge current ICb, and the third charge current ICc.

For example, when the first charge current ICa flows through the first substrate 102a in the +X direction, it will inject pure spin current in the Z direction through the spin Hall effect. The direction of current ICa in +X direction results in the electron polarization direction to be pointing along the +Y direction. The magnetization of the first input nanomagnet 104a is subjected to the spin injection torque, resulting in induced magnetic direction, indicative of an orientation of the magnetic domain. The direction of the charge current (+X or −X) will determine the orientation of the magnetic domain in the first input nanomagnet 104a. As an example, an induced magnetic direction due to first charge current ICa in the +X direction may indicate a logical value of 0, and an induced magnetic direction due to first charge current ICa in the −X direction may indicate a logical value of 1.

Similarly, when the second charge current ICb flows through the second substrate 102b in the +X direction, it will inject pure spin current in the Z direction through the spin Hall effect. The direction of current ICb in the +X direction results in the electron polarization direction to be pointing along the +Y direction. The direction of the charge current (+X or −X) will determine the orientation of the magnetic domain in the second input nanomagnet 104b. As an example, an induced magnetic direction due to second charge current ICb in the +X direction may indicate a logical value of 0, and an induced magnetic direction due to second charge current ICb in the −X direction may indicate a logical value of 1.

Similarly, when the third charge current ICc flows through the third substrate 102c in the +X direction, it will inject pure spin current in the Z direction through the spin Hall effect. The direction of current ICc in the +X direction results in the electron polarization direction to be pointing along the +Y direction. The direction of the charge current (+X or −X) will determine the orientation of the magnetic domain in the third input nanomagnet 104c. As an example, an induced magnetic direction due to third charge current ICc in the +X direction may indicate a logical value of 0, and an induced magnetic direction due to third charge current ICc in the −X direction may indicate a logical value of 1.

The state of the first input nanomagnet 104a, second input nanomagnet 104b, and third input nanomagnet 104c is selectively set due to spin torque effect by the first charge current ICa flowing through the first substrate 102a, the second charge current ICb flowing through the second substrate 102b, and the third charge current ICc flowing through the third substrate 102c. The resultant interaction of the first input nanomagnet 104a, second nanomagnet 104b, and the third nanomagnet 104c gets antiferromagnetically exchange coupled to the output nanomagnet 108, through the spacer layer 106.

In one example, charge current flowing through the first substrate 102a, second substrate 102b, and third substrate 102c produce a spin orbit torque, in each of the first substrate 102a, second substrate 102b, and third substrate 102c. The generated spin orbit torque drives the orientation of the magnetic field in the first input magnet 104a, second input magnet 104b, and third input magnet 104c respectively. The output magnet 108 separated by the spacer layer 106 obtains an antiferromagnetic coupling from the first input magnet 104a, second input magnet 104b, and third input magnet 104c, where the output magnet 108 is interlayer exchange coupled with the first input magnet 104a, second input magnet 104b, and third input magnet 104c. As the output magnet 108 is a single domain nanomagnet, the majority of the state of the first input nanomagnet 104a, second input nanomagnet 104b, and the third input nanomagnet 104c determine the state of the output magnet 108. Various interactions due to different magnetic domain polarization of the first input nanomagnet 104a, second nanomagnet 104b, and the third nanomagnet 104c is now explained.

FIGS. 2A, 2B, 2C, and 2D represent an example implementation of a NAND logic. In this example, the direction of one of the charge currents, for example, the first charge current ICa is selected to indicate a value of 0, and the direction of the other charge currents, for example, direction of second charge current ICb, and third charge current ICc are selectively changed to set various inputs to the logic device, and getting corresponding outputs indicative of a NAND logic.

Figure 2A:
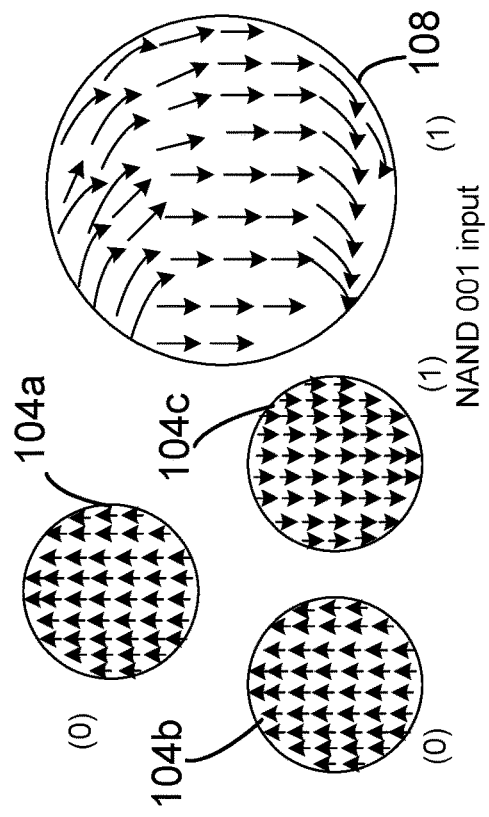
FIGS. 2A, 2B, 2C, and 2D show various inputs and corresponding output states of the logic device implementing a NAND logic, according to one aspect of the present disclosure.

Now, referring to FIG. 2A, first input nanomagnet 104a, second nanomagnet 104b, the third nanomagnet 104c, and output magnet 108 are shown. In this example, the direction of first charge current ICa is selected to indicate a value of 0, which is shown with magnetic spins pointing upwards in the first input nanomagnet 104a. This will generate an antiferromagnetic state with the spins pointing downwards in the output magnet 108. Similarly, the direction of second charge current ICb is selected to indicate a value of 0, which is shown with magnetic spins pointing upwards in the second input nanomagnet 104b. This will generate an antiferromagnetic state with the spins pointing downwards in the output magnet 108. Similarly, the direction of third charge current ICc is selected to indicate a value of 0, which is shown with magnetic spins pointing upwards in the third input nanomagnet 104c. This will generate an antiferromagnetic state with the spins pointing downwards in the output magnet 108. Based on the direction of magnetic spins in the output magnet 108 will together result in a total magnetic spin pointing downwards. As the output magnet 108 is a single domain nanomagnet, the majority of the state of the first input nanomagnet 104a, second input nanomagnet 104b, and the third input nanomagnet 104c determine the state of the output magnet 108. As the magnetic spin pointing upwards was indicative of a value of 0, the magnetic spin pointing downwards will indicate a value of 1. In other words, in this example, the input to the logic device due to second input nanomagnet 102b and third input nanomagnet 102c was {0,0} and the output was {1}. As one skilled in the art appreciates, this is indicative of a NAND operation.

Figure 2B:
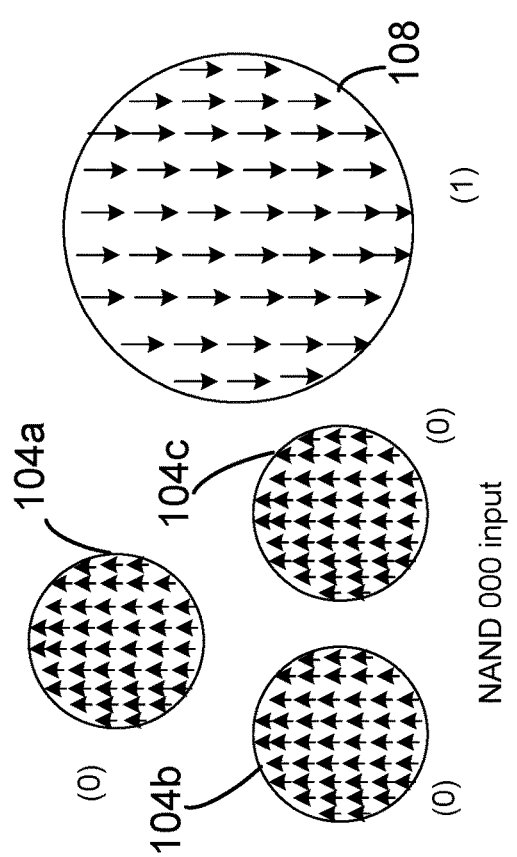

Now, referring to FIG. 2B, first input nanomagnet 104a, second nanomagnet 104b, the third nanomagnet 104c, and output magnet 108 are shown. In this example, the direction of first charge current ICa is selected to indicate a value of 0, which is shown with magnetic spins pointing upwards in the first input nanomagnet 104a. This will generate an antiferromagnetic state with the spins pointing downwards in the output magnet 108. Similarly, the direction of second charge current ICb is selected to indicate a value of 0, which is shown with magnetic spins pointing upwards in the second input nanomagnet 104b. This will generate an antiferromagnetic state with the spins pointing downwards in the output magnet 108. Similarly, the direction of third charge current ICc is selected to indicate a value of 1, which is shown with magnetic spins pointing downwards in the third input nanomagnet 104c. This will generate an antiferromagnetic state with the spins pointing upwards in the output magnet 108. Based on the direction of magnetic spins in the output magnet 108 will together result in a total magnetic spin pointing downwards. As the output magnet 108 is a single domain nanomagnet, the majority of the state of the first input nanomagnet 104a, second input nanomagnet 104b, and the third input nanomagnet 104c determine the state of the output magnet 108. As the magnetic spin pointing upwards was indicative of a value of 0, the magnetic spin pointing downwards will indicate a value of 1. As previously described, in this example, the direction of first charge current ICa flowing through the first input magnet 102a is selected to indicate a value of 0. In other words, in this example, the input to the logic device due to second input nanomagnet 102b and third input nanomagnet 102c was {0,1}. The combination of input to the logic device due to first nanomagnet 102b with an input of {0}, the second nanomagnet 102b with an input of {0}, and the third nanomagnet 102c with an input of {1} will together provide an output of {1}. As one skilled in the art appreciates, this is also indicative of a NAND operation.

Figure 2C:
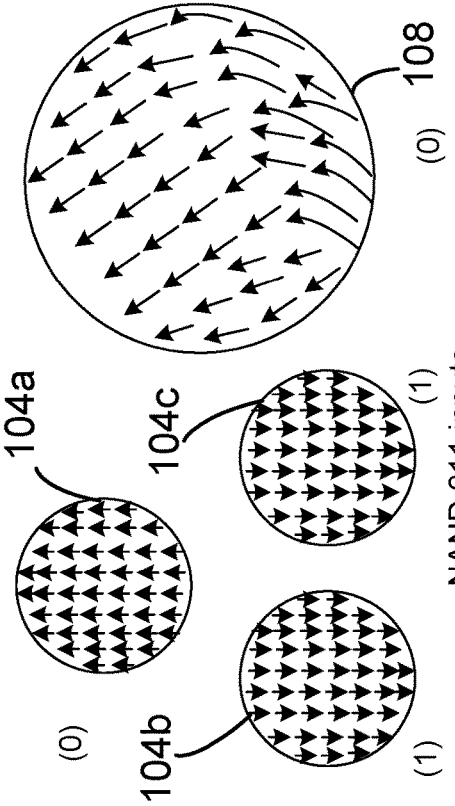

Now referring to FIG. 2C, by selectively choosing the direction of the first charge current ICa, second charge current ICb, and the third charge current ICc, the spin direction in the first input nanomagnet 104a, the second nanomagnet 104b, and the third nanomagnet 104c are set to represent input values of {0, 1, 0} respectively. And we notice that based on the spin direction of the output magnet 108, the output has a value of 1. In other words, in this example, the input to the logic device due to second input nanomagnet 102b and third input nanomagnet 102c was {1,0} and the output was {1}. This example is again, an indicative of a NAND operation.

Figure 2D:
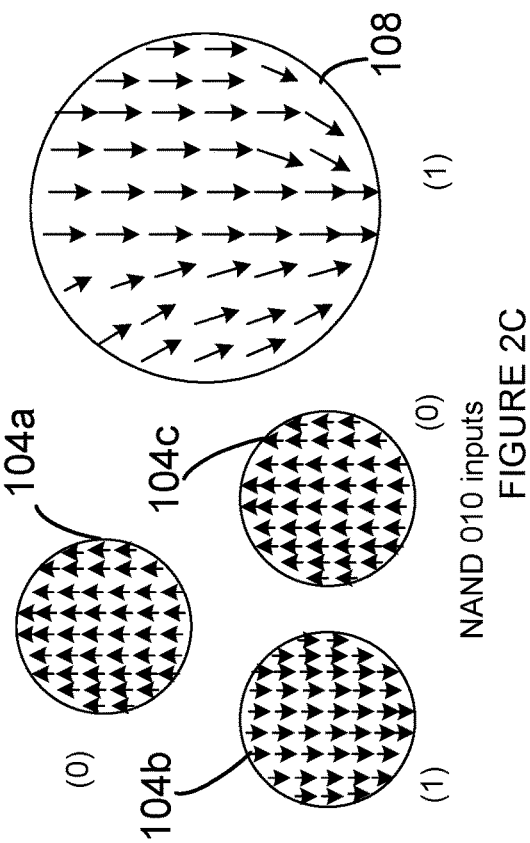

Now referring to FIG. 2D, by selectively choosing the direction of the first charge current ICa, second charge current ICb, and the third charge current ICc, the spin direction in the first input nanomagnet 104a, the second nanomagnet 104b, and the third nanomagnet 104c are set to represent input values of {0, 1, 1} respectively. And we notice that based on the spin direction of the output magnet 108, the output has a value of 0. In other words, in this example, the input to the logic device due to second input nanomagnet 102b and third input nanomagnet 102c was {1,1} and the output was {0}. This example is again, an indicative of a NAND operation.

FIGS. 3A, 3B, 3C, and 3D represent an example implementation of a NOR logic. In this example, the direction of one of the charge currents, for example, the first charge current ICa is selected to indicate a value of 1, and the direction of the other charge currents, for example, direction of second charge current ICb, and third charge current ICc are selectively changed to set various inputs to the logic device, and getting corresponding outputs indicative of a NOR logic.

Figure 3B:
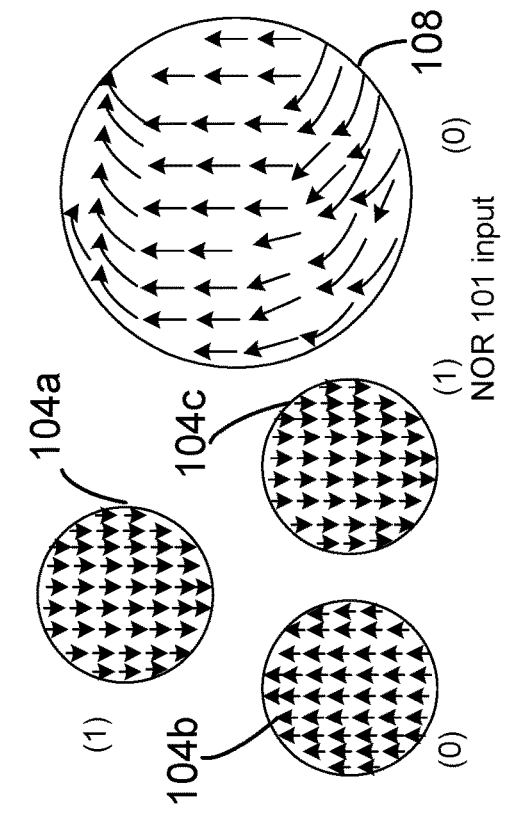
FIGS. 3A, 3B, 3C, and 3D show various inputs and corresponding output states of the logic device implementing a NOR logic, according to one aspect of the present disclosure.
Figure 3D:
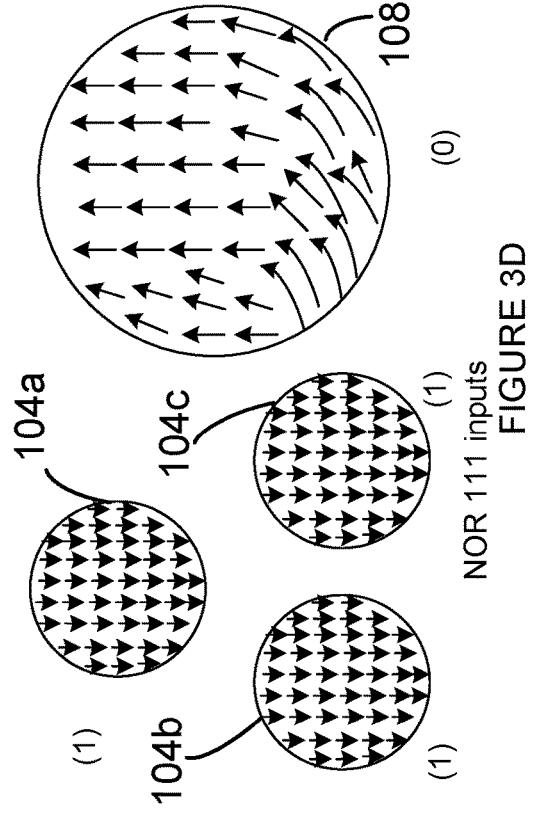
Figure 3A:
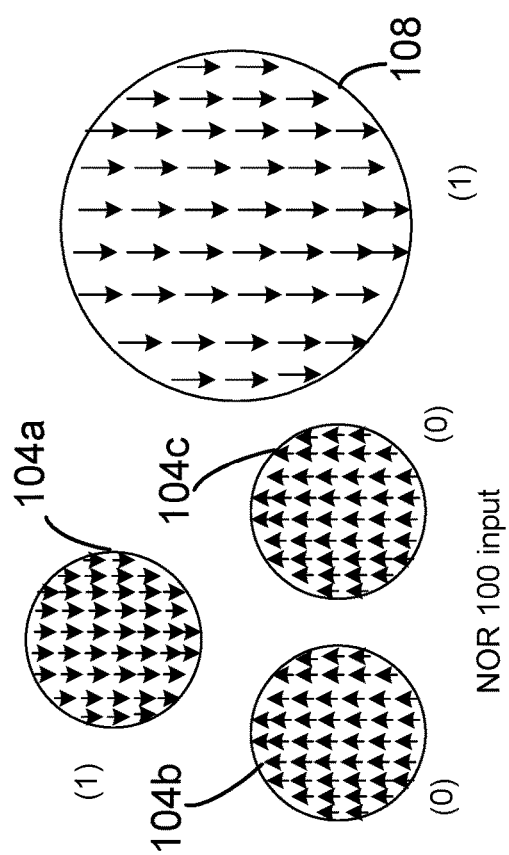

Now, referring to FIG. 3A, first input nanomagnet 104a, second nanomagnet 104b, the third nanomagnet 104c, and output magnet 108 are shown. In this example, the direction of first charge current ICa is selected to indicate a value of 1, which is shown with magnetic spins pointing downwards in the first input nanomagnet 104a. This will generate an antiferromagnetic state with the spins pointing upwards in the output magnet 108. Similarly, the direction of second charge current ICb is selected to indicate a value of 0, which is shown with magnetic spins pointing upwards in the second input nanomagnet 104b. This will generate an antiferromagnetic state with the spins pointing downwards in the output magnet 108. Similarly, the direction of third charge current ICc is selected to indicate a value of 0, which is shown with magnetic spins pointing upwards in the third input nanomagnet 104c. This will generate an antiferromagnetic state with the spins pointing downwards in the output magnet 108. Based on the direction of magnetic spins in the output magnet 108 will together result in a total magnetic spin pointing downwards. As the magnetic spin pointing upwards was indicative of a value of 0, the magnetic spin pointing downwards will indicate a value of 1. In other words, in this example, the input to the logic device due to second input nanomagnet 102*b* and third input nanomagnet 102*c* was {0,0} and the output was {1}. As one skilled in the art appreciates, this is indicative of a NOR operation.

Now, referring to FIG. 3B, first input nanomagnet 104*a*, second nanomagnet 104*b*, the third nanomagnet 104*c*, and output magnet 108 are shown. In this example, the direction of first charge current ICa is selected to indicate a value of 1, which is shown with magnetic spins pointing downwards in the first input nanomagnet 104*a*. This will generate an antiferromagnetic state with the spins pointing upwards in the output magnet 108. Similarly, the direction of second charge current ICb is selected to indicate a value of 0, which is shown with magnetic spins pointing upwards in the second input nanomagnet 104*b*. This will generate an antiferromagnetic state with the spins pointing downwards in the output magnet 108. Similarly, the direction of third charge current ICc is selected to indicate a value of 1, which is shown with magnetic spins pointing downwards in the third input nanomagnet 104*c*. This will generate an antiferromagnetic state with the spins pointing upwards in the output magnet 108. Based on the direction of magnetic spins in the output magnet 108 will together result in a total magnetic spin pointing upwards. As the magnetic spin pointing upwards was indicative of a value of 0, the magnetic spin pointing downwards will indicate a value of 1. In other words, in this example, the input to the logic device due to second input nanomagnet 102*b* and third input nanomagnet 102*c* was {0,1} and the output was {0}. As one skilled in the art appreciates, this is also indicative of a NOR operation.

Figure 3C:
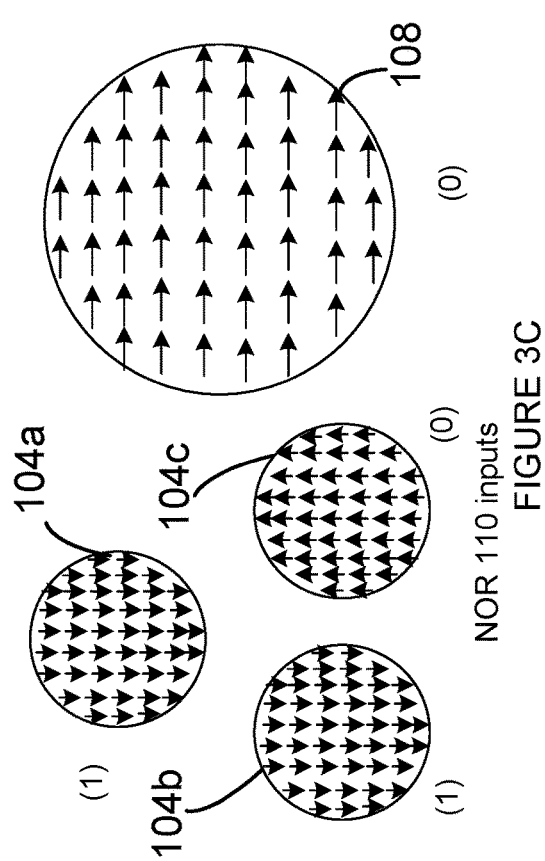

Now referring to FIG. 3C, by selectively choosing the direction of the first charge current ICa, second charge current ICb, and the third charge current ICc, the spin direction in the first input nanomagnet 104*a*, the second nanomagnet 104*b*, and the third nanomagnet 104*c* are set to represent input values of {1, 1, 0} respectively. And we notice that based on the spin direction of the output magnet 108, the output has a value of 0. In other words, in this example, the input to the logic device due to second input nanomagnet 102*b* and third input nanomagnet 102*c* was {1,0} and the output was {0}. This example is again, an indicative of a NOR operation.

Now referring to FIG. 3D, by selectively choosing the direction of the first charge current ICa, second charge current ICb, and the third charge current ICc, the spin direction in the first input nanomagnet 104*a*, the second nanomagnet 104*b*, and the third nanomagnet 104*c* are set to represent input values of {1, 1, 1} respectively. And we notice that based on the spin direction of the output magnet 108, the output has a value of 0. In other words, in this example, the input to the logic device due to second input nanomagnet 102*b* and third input nanomagnet 102*c* was {1,1} and the output was {0}. This example is again, an indicative of a NOR operation.

As one skilled in the art appreciate, a suitable sensor may be operatively disposed relative to the output magnet 108 to selectively measure the magnetic orientation of the output magnet 108, to determine a polarity of the magnetic domain, thereby determining a value of 0 or 1.

Now, referring to FIG. 4, an example table 400 is described. Column 402 shows various inputs to the first input nanomagnet 104*a*, the second nanomagnet 104*b*, and the third nanomagnet 104*c*. Column 404 shows various outputs of the output magnet 108, based on various inputs. Column 406 shows the logic type, either a NAND logic or a NOR logic. Rows 408, 410, 412, and 414 show various inputs and corresponding outputs of the logic device, implementing a NAND logic, as previously described with reference to FIGS. 2A, 2B, 2C, and 2D respectively. Rows 416, 418, 420, and 422 show various inputs and corresponding outputs of the logic device, implementing a NOR logic, as previously described with reference to FIGS. 3A, 3B, 3C, and 3D respectively.

Figure 5:
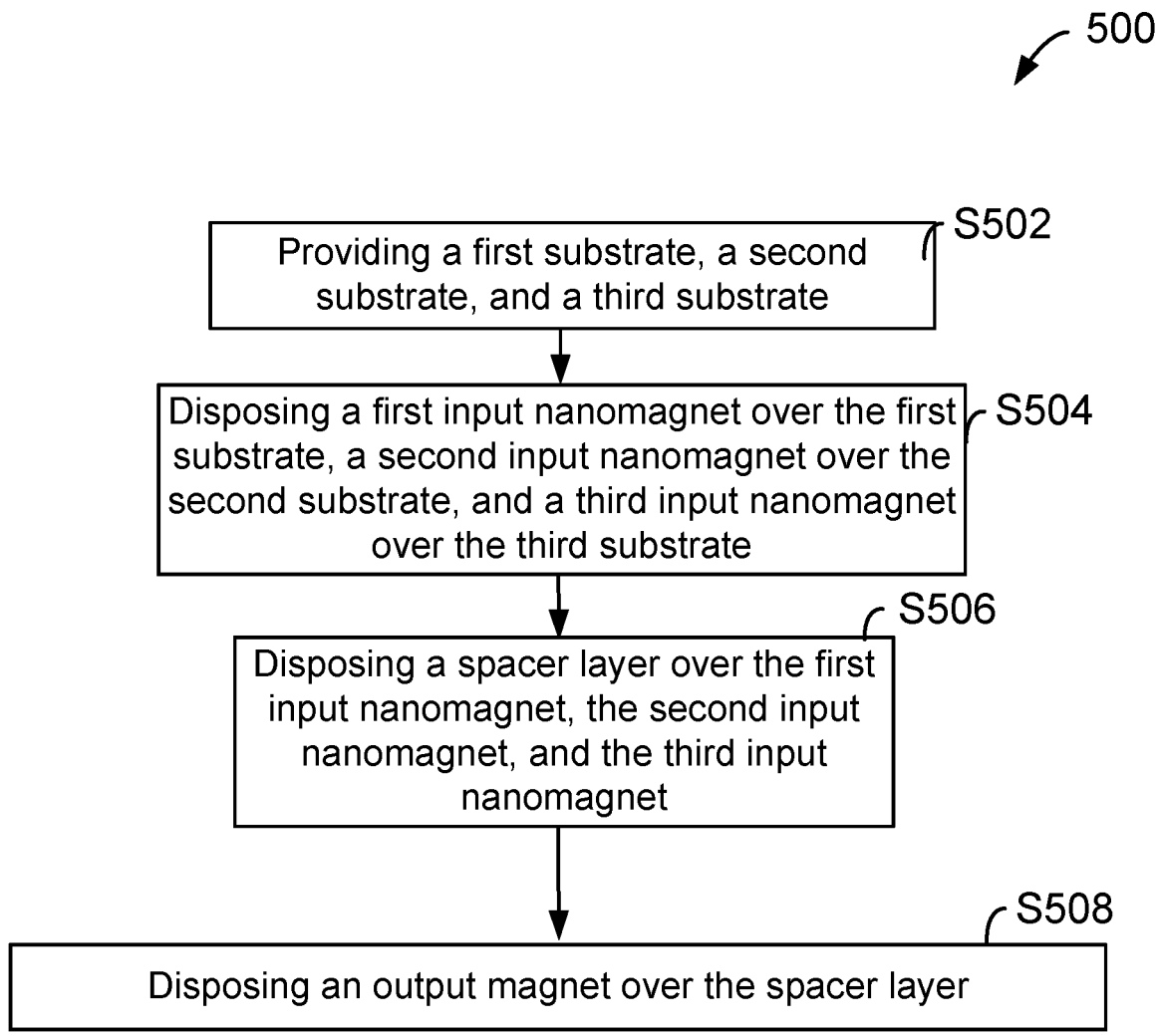
FIG. 5 shows an example flow diagram, according to one aspect of the present disclosure.

Now, referring to FIG. 5, an example flow diagram 500 is described. In block S502, a first substrate, a second substrate, and a third substrate is provided. For example, first substrate 102*a*, second substrate 102*b*, and third substrate 102*c* are provided.

In block S504, a first input nanomagnet is disposed over the first substrate, a second input nanomagnet is disposed over the second substrate, and a third input nanomagnet is disposed over the third substrate. For example, a first input nanomagnet 104*a* is disposed over the first substrate 102*a*, a second input nanomagnet 104*b* is disposed over the second substrate 102*b*, and a third input nanomagnet 104*c* is disposed over the third substrate 102*c*.

In block S506, a spacer layer is disposed over the first input nanomagnet, the second input nanomagnet, and the third input nanomagnet. For example, a spacer layer 106 is disposed over the first input nanomagnet 104*a*, the second input nanomagnet 104*b*, and the third input nanomagnet 104*c*.

In block S508, an output magnet is disposed over the spacer layer. For example, an output magnet 108 is disposed over the spacer layer 106.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that phraseology or terminology employed herein is for the purpose of description and not of limitation.

While embodiments of the present invention are described above with respect to what is currently considered its preferred embodiments, it is to be understood that the invention is not limited to that described above. To the contrary, the invention is intended to cover various modifications and equivalent arrangements within the spirit and scope of the appended claims.

What is claimed is:

1. A method, including:
providing a first substrate, a second substrate and a third substrate;
disposing a first input nanomagnet over the first substrate;
disposing a second input nanomagnet over the second substrate;
disposing a third input nanomagnet over the third substrate,
wherein, the first input nanomagnet, the second input nanomagnet and the third input nanomagnet are disposed substantially equidistant from each other, and
wherein, each of the first input nanomagnet, the second input nanomagnet, and the third input nanomagnet are each a single domain nanomagnet;

disposing a spacer layer over the first nanomagnet, the second input nanomagnet and the third input nanomagnet; and disposing an output magnet over the spacer layer, wherein, the output magnet is a single domain nanomagnet.

2. The method of claim 1, further including selectively passing a first charge current through the first substrate, a second charge current through the second substrate, and a third charge current through the third substrate, based on a direction of the first current, the direction of the second current, and the direction of the third current, a direction of orientation of the first nanomagnet, the second nanomagnet, and the third nanomagnet is selectively set.

3. The method of claim 2, wherein the direction of orientation of the first nanomagnet, the second nanomagnet, and the third nanomagnet cumulatively set a direction of orientation of the output magnet.

4. The method of claim 3, further including:
changing the direction of orientation of the output magnet, by selectively changing direction of current flow of one or more of the first charge current, the second charge current and the third charge current.

5. The method of claim 3, wherein the first input nanomagnet, the second input nanomagnet, the third input nanomagnet and the output magnet each have a first direction of orientation and a second direction of orientation, with the first direction of orientation substantially opposite to the second direction of orientation, wherein, the first direction of orientation is indicative of a zero, and the second direction of orientation is indicative of a one.

6. The method of claim 5, wherein,
when at least two or all of the first input nanomagnet, the second input nanomagnet and the third input nanomagnet have a first direction of orientation, the direction of orientation of the output nanomagnet is substantially in the second direction of orientation.

7. The method of claim 5, wherein,
when two or more of the first input nanomagnet, the second input nanomagnet and the third input nanomagnet have a second direction of orientation, the direction of orientation of the output nanomagnet is substantially in the first direction of orientation.

8. The method of claim 2, wherein, the first substrate, the second substrate, and the third substrate are each composed of a heavy metal,
wherein, the first charge current, the second charge current, and the third charge current each produce a spin orbit torque in the first substrate, the second substrate, and the third substrate and drives an orientation of magnetic field in the first input nanomagnet, the second input nanomagnet, and the third input nanomagnet; and
the output magnet separated by the space layer obtains an antiferromagnetic coupling from the first input magnet, the second input magnet, and the third input magnet.

9. The method of claim 8, wherein a majority of the orientation of the first input nanomagnet, the second input nanomagnet, and the third input nanomagnet determines the orientation of the output magnet.

10. The method of claim 1, wherein,
a diameter of the first nanomagnet, the second nanomagnet and the third nanomagnet is of the order of about 8 nm; and
a diameter of the output magnet is of the order of about 20 nm.

11. A logic device, including:
a first substrate, a second substrate and a third substrate;
a first input nanomagnet disposed over the first substrate;
a second input nanomagnet disposed over the second substrate;
a third input nanomagnet disposed over the third substrate,
wherein, the first input nanomagnet, the second input nanomagnet and the third input nanomagnet are disposed substantially equidistant from each other, and
wherein, each of the first input nanomagnet, the second input nanomagnet, and the third input nanomagnet are each a single domain nanomagnet;
a spacer layer disposed over the first nanomagnet, the second input nanomagnet and the third input nanomagnet; and
an output magnet disposed over the spacer layer, wherein, the output magnet is a single domain nanomagnet.

12. The logic device of claim 11, wherein, a first charge current is selectively passed through the first substrate, a second charge current is selectively passed through the second substrate, and a third charge current is selectively passed through the third substrate, based on a direction of the first current, the direction of the second current, and the direction of the third current, a direction of orientation of the first nanomagnet, the second nanomagnet, and the third nanomagnet is selectively set.

13. The logic device of claim 12, wherein the direction of orientation of the first nanomagnet, the second nanomagnet, and the third nanomagnet cumulatively set a direction of orientation of the output magnet.

14. The logic device of claim 13, wherein,
the direction of orientation of the output magnet is changed, by selectively changing direction of current flow of one or more of the first charge current, the second charge current and the third charge current.

15. The logic device of claim 13, wherein the first input nanomagnet, the second input nanomagnet, the third input nanomagnet and the output magnet each have a first direction of orientation and a second direction of orientation, with the first direction of orientation substantially opposite to the second direction of orientation, wherein, the first direction of orientation is indicative of a zero, and the second direction of orientation is indicative of a one.

16. The logic device of claim 15, wherein,
when at least two or all of the first input nanomagnet, the second input nanomagnet and the third input nanomagnet have a first direction of orientation, the direction of orientation of the output nanomagnet is substantially in the second direction of orientation.

17. The logic device of claim 15, wherein,
when two or more of the first input nanomagnet, the second input nanomagnet and the third input nanomagnet have a second direction of orientation, the direction of orientation of the output nanomagnet is substantially in the first direction of orientation.

18. The logic device of claim 11, wherein,
a diameter of the first nanomagnet, the second nanomagnet and the third nanomagnet is of the order of about 8 nm; and
a diameter of the output magnet is of the order of about 20 nm.

19. The logic device of claim 11, wherein, the first substrate, the second substrate, and the third substrate are each composed of a heavy metal,
wherein, the first charge current, the second charge current, and the third charge current each produce a spin orbit torque in the first substrate, the second substrate, and the third substrate and drives an orientation of magnetic field in the first input nanomagnet, the second input nanomagnet, and the third input nanomagnet; and the output magnet separated by the space layer obtains an antiferromagnetic coupling from the first input magnet, the second input magnet, and the third input magnet.

20. The logic device of claim 19, wherein majority of the orientation of the first input nanomagnet, the second input nanomagnet, and the third input nanomagnet determines the orientation of the output magnet.

\* \* \* \* \*